United States Patent [19]

Hirose et al.

[11] Patent Number: 4,973,883
[45] Date of Patent: Nov. 27, 1990

[54] PLASMA PROCESSING APPARATUS WITH A LISITANO COIL

[75] Inventors: Naoki Hirose; Takashi Inugima; Toru Takayama, all of Atsugi, Japan

[73] Assignee: Semiconductor Energy Laborator Co., Ltd., Atsugi, Japan

[21] Appl. No.: 188,412

[22] Filed: Apr. 29, 1988

[30] Foreign Application Priority Data

May 1, 1987 [JP] Japan .................................. 62-108675

[51] Int. Cl.⁵ .................... H01J 7/24; H05B 31/26
[52] U.S. Cl. ......................... 315/111.41; 315/111.61; 315/111.71
[58] Field of Search ................ 315/111.41, 111.61, 315/111.71; 376/121, 139, 140

[56] References Cited

U.S. PATENT DOCUMENTS

| | | | |
|---|---|---|---|
| 4,166,760 | 9/1979 | Fowler et al. | 376/140 |
| 4,293,794 | 10/1981 | Kapetanakos | 315/111.41 |
| 4,438,368 | 3/1984 | Abe et al. | 315/111.41 |
| 4,481,229 | 11/1984 | Suzuki et al. | 437/225 |
| 4,713,585 | 12/1987 | Ohno et al. | 315/111.71 |
| 4,745,337 | 5/1988 | Pichot et al. | 315/111.21 |
| 4,778,561 | 10/1988 | Ghahbari | 118/728 |
| 4,806,829 | 2/1989 | Nakao | 315/111.41 |

Primary Examiner—Eugene R. LaRoche
Assistant Examiner—Michael Shingleton
Attorney, Agent, or Firm—Sixbey, Friedman, Leedom & Ferguson

[57] ABSTRACT

A plasma processing apparatus and method is equipped with a vacuum chamber, helmholtz coils, a microwave generator and gas feeding systems. The microwave generator consists of a lisitano coil which is capable of emitting a microwave in the $TE_{011}$ mode. In the light of such a microwave, a high quality film can be deposited.

8 Claims, 6 Drawing Sheets

FIG. I
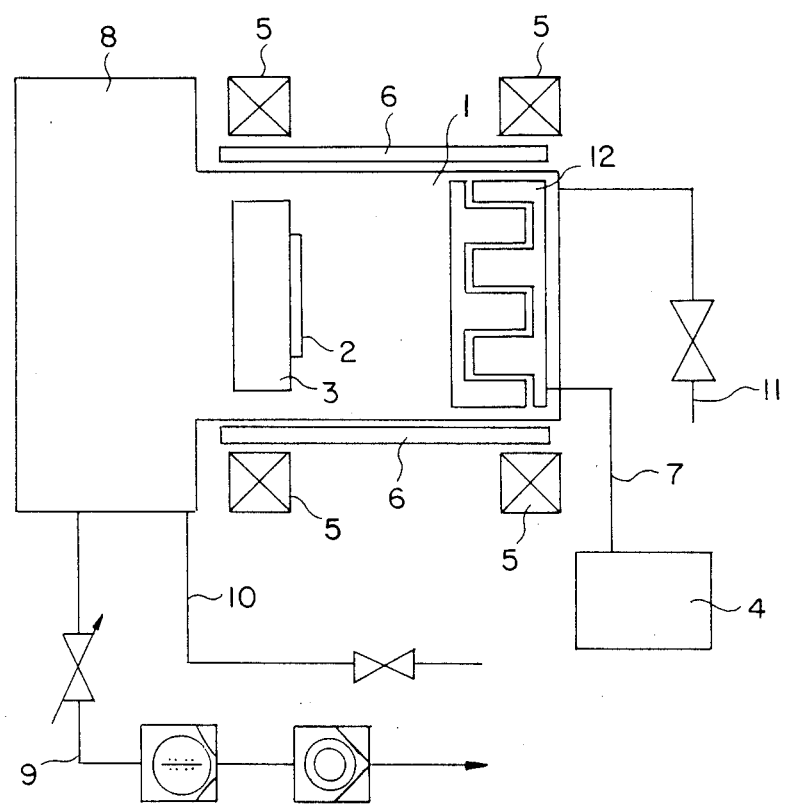

PLASMA PROCESSING APPARATUS WITH A LISITANO COIL

BACKGROUND OF THE INVENTION

This invention relates to a plasma processing apparatus with a Lisitano coil.

There have been known the ECR CVD (Electron Cycrotron Resonance Chemical Vapor Deposition) for depositing thin films on a substrate. In this deposition method, a substrate may be placed in a vacuum chamber apart from the resonating space and a thin film such as an amorphous film is formed on the substrate by virtue of a divergent magnetic field induced in the vacuum chamber.

The ECR CVD can be performed in combination with another known deposition method such as heated filament CVD, chemical transportation method, plasma CVD making use of a high frequency power at 13.56 MHz, microwave-assisted CVD or the like. In accordance with this method, a reactive gas is confined and excited by supplying a microwave under a magnetic field in accordance with the electron cycrotron resonance. The excited reactive gas is drifted to a substrate which is located at a position remote from the resonating space. At the remote position, the excited gas deposits its product on the substrate or attaches to the substrate to effect anisotropic etching. The pressure in the chamber during process has been maintained at a relatively low pressure, e.g. of the order of $10^{-4}$ Torr. Because of this, it is very difficult to form a highly crystallized film such as a diamond film and to choose the process condition with a broad flexibility.

SUMMARY OF THE INVENTION

It is therefore an object of the invention to provide a plasma processing apparatus in which a highly energized plasma gas is generated by virtue of a microwave which is transmitted in a desirable mode.

It is therefore an object of the invention to provide a plasma processing apparatus and method in which highly crystallized films can be deposited under flexible condition.

According to one aspect of the invention, a Lisitano coil is provided as the microwave generator to produce a $TE_{011}$ mode microwave.

The resonance taking place in the reaction chamber includes the electron cycrotron resonance, the whistler mode resonance, or other type resonance which is caused by supplying a microwave under a magnetic field such as the mixed cyclotron resonance. By virtue of such a resonance, a highyly energized plasma gas having a high energy density is generated. In case of carbon deposition, a highly energized plasma produces a large amount of excited carbon atoms and the high reproducibility is achieved.

BRIEF DESCRIPTION OF THE INVENTION

FIG. 1 is a schematic diagram showing a plasma processing apparatus in accordance with the present invention.

FIG. 2(A) and 2(B) are a cross sectional view and a side elevation view showing Ioffe bars for use in accordance with the present invention.

Figure 6A:
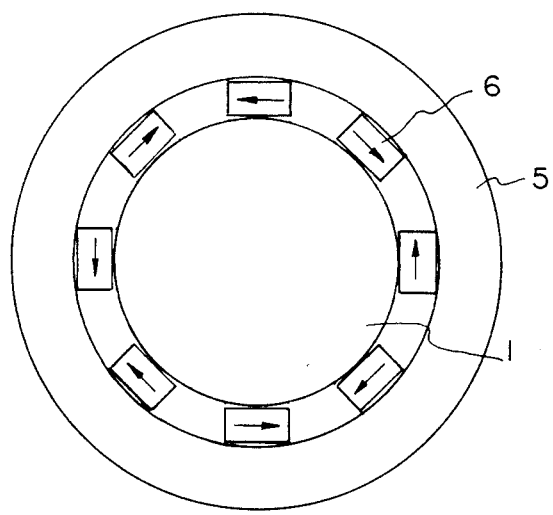
Figure 6B:
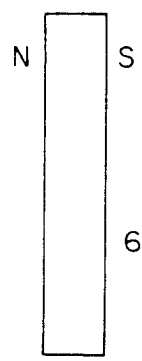

FIGS. 6(A) and 6(B) are a cross sectional view and a side elevation view showing Ioffe bars of another type for use in accordance with the present invention.

Figure 7:
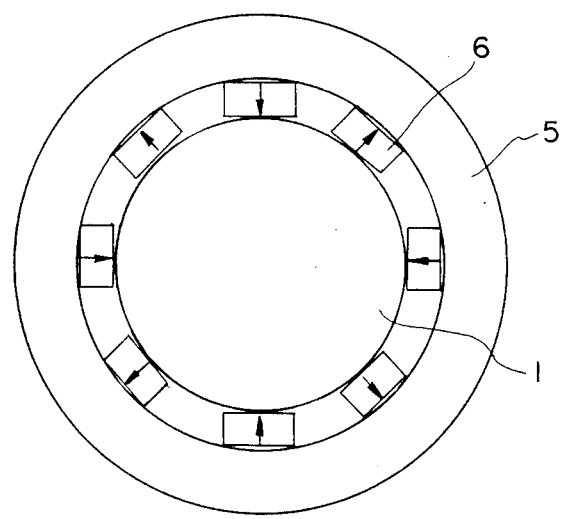

FIG. 7 is a cross sectional view showing Ioffe bars of a further type for use in accordance with the present invention.

DESCRIPTION OF THE PREFERRED EMBODIMENTS

Referring to FIG. 1, a microwave assisted plasma-CVD apparatus in accordance with the present invention is illustrated. In the figure, the apparatus comprises a reaction vacuum chamber 1 defining a resonating space therein, a loading chamber 8 connected with the vacuum chamber 1, a substrate holder 3 capable of carrying a substrate 2 to be treated, helmholtz coils 5 around the reaction chamber 1, an auxiliary electron-magneto 6 located inside of the helmholtz coils around the reaction chamber, a microwave oscillator 4 connected to the reaction chamber 1 through a cable 7, an evacuating system 9, and gas feeding systems 10 and 11. The holder 3 is made of a highly thermal conductive material, such as aluminium nitride, which less disturb the microwave transmission from a Lisitano coil 12.

Figure 2A:
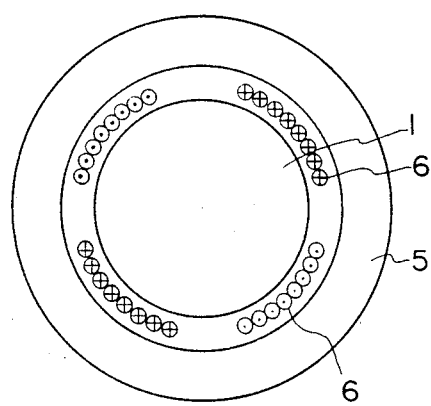
Figure 2B:
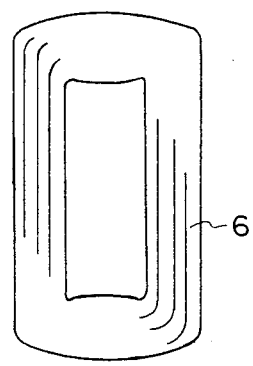
Figure 3:
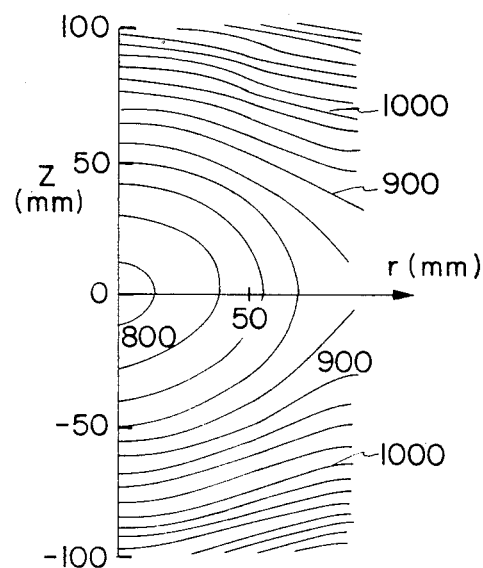
FIG. 3 is a graphical diagram showing the strength of magnetic field in a reaction chamber in accordance with the present invention.
Figure 4:
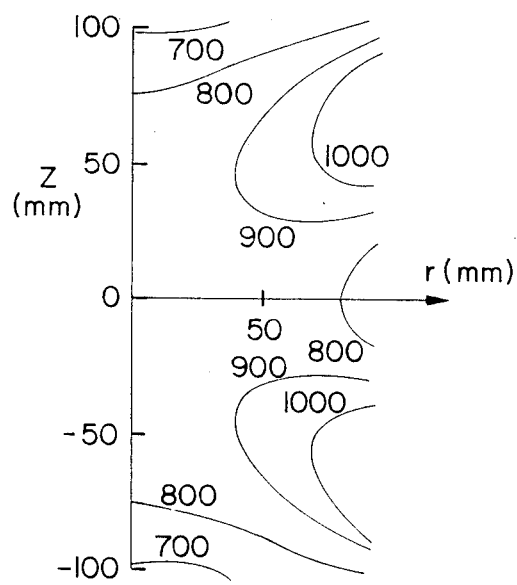
FIG. 4 is a graphical diagram showing the strength of magnetic field induced only by helmholtz coils in a reaction chamber.

The auxiliary magnet 6 consists of two electromagnetos providing Ioffe bars which extend in the direction of the microwave propagation (FIGS. 2(A) and 2(B)). In FIG. 2(A), the end marks of arrow denote the current passing direction in each bar. The object of the provision of the Ioffe bars is to strengthen the strength of magnetic field near the cylindrical wall of the reaction chamber 1. FIG. 3 is a graphical diagram showing the surfaces on each of which the strength of the magnetic field is constant. The abscissa is the distance (r) from the axis of the cylindrical reaction chamber and the ordinate is the axial distance from the center plane between the helmholtz coils 5. The figure given to each surface denotes the strength (Gauss) of the magnetic field on that surface. As shown in the diagram, the strength of the magnetic field takes a larger value at a nearer position to the cylindrical wall, so that the drifted force excerted on the plasma is always centrifugal. The magnetic field is weakest on the axis of the cylindrical reaction chamber. FIG. 4 is a graphical diagram showing the surfaces on which the magnetic field is constant when the auxiliary magnet is not used.

The Lisitano coil is characterized in that the diameter thereof can be selected irrespective of the frequency of the microwave to be emitted. The emission of microwave can be accomplished by designing the axial length of the groove of the coil at the half of the wavelength. For instance, about 6 cm for 2.45 GHz.

The relative position of the Lisitano coil to the helmholtz coils can be selected so that drifting force is excerted on the plasma gas toward the substrate to be treated and therefore undesirable deposition on surfaces other than the substrate is avoided.

Next, the deposition process with this apparatus will be described. A substrate 1 is mounted on the holder 3 and disposed at an appropriate position in the reaction chamber 1 where the microwave and the magnetic field satisfy the ECR condition. After evacuating the reaction chamber 1, the substrate 1 is heated to 500° C. and hydrogen is leaked into the chamber 1 at 10SCCM through the gas feeding system 11. The introduced hydrogen gas is energized into a plasma gas by virtue of a 2.45 GHz microwave emitted from the Lisitano coil 12 and a magnetic field induced by both the helmholtz coils 5 and the auxiliary magnet 6. The strength of the portion of the magnetic field that is induced by the coils 5 is about 2K Gauss at the resonating space (a portion of the reaction chamber). The pressure in the resonating space is maintained at 0.1 Pascal. The surface of the substrate is cleaned by virtue of the plasma.

Then, the introduction of hydrogen is halted and a carbon compound gas such as $C_2H_2$ or $CH_4$ is introduced into the reaction chamber 1 and excited in the same way as hydrogen as explained above. By this process, a diamond or i-carbon film is deposited on the substrate which has been heated to about 500° C. According to experimental, data diamond films were deposited particularly when the substrate temperatures were not higher than 650° C.

In accordance with the electron beam defraction analysis, a halo pattern was observed at a relative low temperature together with a spot pattern which is particular to amorphous structures. Such an image indicates the presence of i-carbon. The halo pattern gradually disappears as the substrate temperature was elevated. When the structure temperature was elevated higher than 650° C., the deposited film became composed mainly of diamond. The diamond film was confirmed by examinating its Raman spectrum. The spectrum includes a moderate peak about 1500 $cm^{-1}$ and a sharp peak about 1333 $cm^{-1}$.

For comparison, the same process was repeated without inducing a magnetic field in the reaction chamber. The film thus deposited was made of graphite. Even with the presence of magnetic field, no i-carbon film could be deposited on a substrate at a temperature lower than 150° C.

The above process can be applied to a method by depositing polycrystalline silicon carbide films by making use of silicon carbide gaseous compounds as the reactive gas, to a method of depositing aluminium nitride films by making use of a reactive gas consisting of an aluminium compound gas and ammonia, and a method of depositing films having a high melting point, e.g. films made of tungsten, titanium and molybdenum or their silicon compounds. In the same way, the present invention can be applied for the deposition of BN, CN, TiN and BP.

Figure 5:
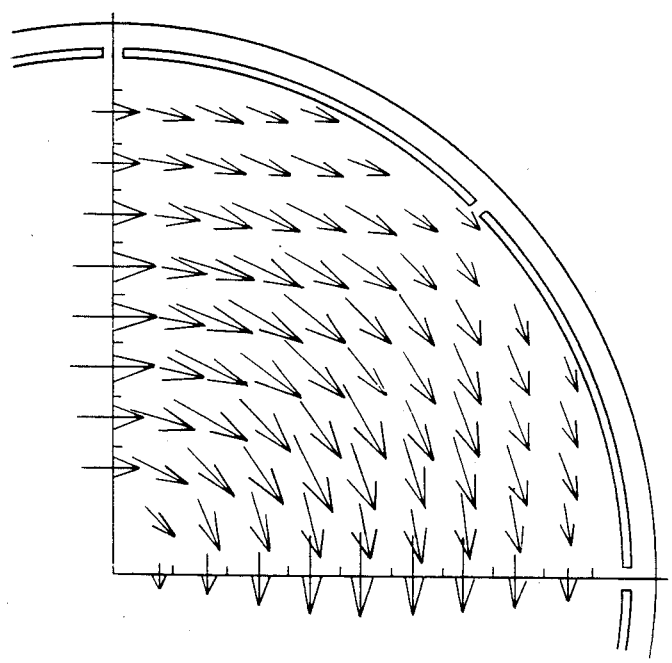
FIG. 5 is a graphical diagram showing electric field of the microwave emitted from a Lisitano coil in accordance with the present invention.

FIG. 5 is a schematic veiw on a quadrant section of the resonating chamber showing the oscillating direction of electric field of the microwave which is produced by the Lisitano coil 12 supplied with an AC power of a microwave frequency. The arrows in the figure denote the direction and strength of electric field in the reaction chamber at a certain time point. The electric field corresponds to the $TE_{011}$ mode. As shown in the figure, the electric field of microwave appears concentric directing the circumferential direction around the axis of the Lisitano coil 12 or the reaction chamber 1.

The electric field has not its axial component. The electric field has not the strength on an equidistant surface from the axis is constant so that a crystallized film can be deposited not only on a plate but also on a surface of rectangular. The production speed of plasma gas can be changed by selecting the size of the Lisitano coil 12 irrespective of the frequency of the power from the oscillator 4.

The Ioffe magnet may be another type magnet. FIGS. 6(A) and 6(B) are drafted in correspondence with FIGS. 2(A) and 2(B) to show another type of Ioffe magnet suitable for use in accordance with the invention. As shown in the figure, a plurality of rodshaped permanent magnets are arranged immediately inside of the helmholtz coils 5 with their magnetic moments directed to the circumferential direction as indicated by arrows. The magnetic moments can be arranged in the axial direction as shown in FIG. 7.

While a description has been made for several embodiments, the present invention should be limited only by the appended claims and should not be limited by the particular examples. What follow are some examples of modifications and variation according to the invention. By adding oxygen, water or the like to the reactive gas, the crystallinity the exciting plasma gas with ultraviolet rays between the resonating space and the substrate to be coated, the exciting plasma gas can hold its energy even substantially distant from the resonating space. For instance, a diamond or i-carbon film can be deposited on a large area. Also, by applying a DC bias voltage to the exciting plasma, a larger amount plasma reaches the substrate enabling a high deposition speed. Also, as easily understood by those skilled in the art, the present invention is effective when used for plasma etching, particularly by making use of ECR. The etchant gas is excited by virtue of the TE microwave in the same way as explained above.

A uniform formation of films is accomplished by the use of Lisitano coils due to the fact that the strength of electromagnetic fields emitted from these coils is relatively small at the center of the coils. Therefore, the deposition of the edges of the films is essentially equal to that at the center.

We claim:

1. A plasma processing apparatus comprising:
   a vacuum chamber in which is defined a reaction space;
   a microwave generator for emitting a microwave into said vacuum chamber;
   a first means for inducing a first magnetic field substantially parallel with the propagating direction of the magnetic field emitted from said generator;
   a holder for supporting an object to be processed in said reaction space;
   a vacuum pump for evacuating said vacuum chamber; and
   a gas feeding means for inputting a reactive gas to said reaction space,
   wherein said microwave generator consists of a Lisitano coil which is provided in said chamber in order to emit microwaves symmetrically around a center line normal to said holder and an oscillator.

2. The apparatus of claim 1 wherein said Lisitano coil is adapted to emit a microwave in the $TE_{011}$ mode.

3. The apparatus of claim 1 further comprising second means for inducing a second magnetic field whose magnitude is stronger at a remoter position from the center of said reactin space.

4. The apparatus of claim 3 wherein said first magnetic field inducing means consists of Ioffe bars arranged around said reaction space and parallel with the propagation direction of the microwave emitted from said microwave generator.

5. The apparatus of claim 4 wherein said Ioffe bars are constituted by a plurality of coils arranged about said reaction chamber.

6. The apparatus of claim 4 wherein said second magnetic field inducing means are the helmholtz coils.

7. The apparatus of claim 6 wherein said Ioffe bars are a plurality of permanent magnet rods, each having its magnetic moment along the circumferential direction of said helmholtz coils.

8. The apparatus of claim 7 wherein the senses of the magnetic moments of the Ioffe bars are alternating.

* * * * *

UNITED STATES PATENT AND TRADEMARK OFFICE
CERTIFICATE OF CORRECTION

PATENT NO.         : 4,973,883
APPLICATION NO. : 07/188412
DATED                 : November 27, 1990
INVENTOR(S)      : Naoki Hirose et al.

It is certified that error appears in the above-identified patent and that said Letters Patent is hereby corrected as shown below:

On the title page of the patent, the Assignee's name "Semiconductor Energy Laborator Co., Ltd." should be deleted, and replaced with --Semiconductor Energy Laboratory Co., Ltd.--.

Signed and Sealed this

Second Day of June, 2009

JOHN DOLL
*Acting Director of the United States Patent and Trademark Office*